(12) United States Patent  (10) Patent No.: US 8,446,466 B2
Ikeda et al.  (45) Date of Patent: May 21, 2013

(54) COMPONENT MOUNTING METHOD AND COMPONENT MOUNTER

(75) Inventors: Masanori Ikeda, Yamanashi (JP);
Michinori Tomomatsu, Yamanashi (JP);
Satoshi Furuichi, Yamanashi (JP);
Masahiro Taniguchi, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/698,682

(22) PCT Filed: Jun. 14, 2011

(86) PCT No.: PCT/JP2011/003358
§ 371 (c)(1),
(2), (4) Date: Nov. 19, 2012

(87) PCT Pub. No.: WO2011/158488
PCT Pub. Date: Dec. 22, 2011

(65) Prior Publication Data
US 2013/0057676 A1 Mar. 7, 2013

(30) Foreign Application Priority Data
Jun. 16, 2010 (JP) .................................. 2010-137772

(51) Int. Cl.
*H04N 7/18* (2006.01)
*G06K 9/00* (2006.01)

(52) U.S. Cl.
USPC ........................................... 348/87; 382/151

(58) Field of Classification Search
USPC ................. 348/87, 151, 255, 333.12, 207.99, 348/223.1, 225.1, 229.1, 241, 88; 382/167, 382/274, 261, 141
See application file for complete search history.

(56) References Cited

U.S. PATENT DOCUMENTS 3,887,762 A * 6/1975 Uno et al. ..................... 348/126
2011/0205209 A1 * 8/2011 Kurokawa et al. ............ 345/211

FOREIGN PATENT DOCUMENTS

| JP | 2001-068900 | 3/2001 |
| JP | 2006-351911 | 12/2006 |
| JP | 2007-067187 | 3/2007 |
| JP | 2007-294624 | 11/2007 |
| JP | 2010-073929 | 4/2010 |

OTHER PUBLICATIONS

International Search Report issued Jul. 12, 2011 in International (PCT) Application No. PCT/JP2011/003358.

* cited by examiner

*Primary Examiner* — Behrooz Senfi
(74) *Attorney, Agent, or Firm* — Wenderoth, Lind & Ponack, L.L.P.

(57) ABSTRACT

A component mounting method includes: identifying, by image processing, a dark color region from image data obtained by imaging a two-dimensional region including a pickup face of a component to be picked up; deriving position data indicating a position of the identified dark color region; and deriving, based on the derived position data, a pickup position indicating a position at which a nozzle picks up the component. The imaging is performed by an imaging unit, and the dark color region indicates a dark color portion between electrodes of the component.

5 Claims, 7 Drawing Sheets

COMPONENT MOUNTING METHOD AND COMPONENT MOUNTER

TECHNICAL FIELD

The present invention relates to: a component mounter which mounts a component onto a substrate by picking up and holding the component from a component feeding unit, conveying the held component above the substrate, and placing the component onto the substrate; and a component mounting method implemented with the component mounter, and particularly relates to: a component mounter which mounts a miniature component including an electrode at both ends; and a component mounting method implemented with the component mounter.

BACKGROUND ART

Conventionally, a component mounter is available which attaches a component onto a substrate by picking up and holding with a nozzle the component fed to a component feeding unit, conveying the component above the substrate, and putting the component down. Components which are relatively small among the components fed to the component mounter are fed in a state being held in an array in long tape called carrier tape. The carrier tape has rectangular container space, called cavities or the like, intermittently arranged in the longitudinal direction, and each cavity contains one component. The component mounter accurately replicates positions of the cavities by forwarding the carrier tape at an accurate pitch, thereby picking up and holding components disposed in the cavities with nozzles.

In spite of the further miniaturization in electronic components associated with the miniaturization of electronic equipment in recent years, forms of cavities of carrier tape are standardized. This makes it difficult to pick up and hold miniature components well with nozzles in some cases, since miniature components (miniature chip components in size of 1005, 0603, and 0402, for example) are unevenly disposed in the cavities due to variation in dimensional tolerance of the cavities and the components.

Therefore, Patent Literature (PTL) 1 discloses a technique by which a pickup position of a component is determined based on image information obtained by imaging a component to be picked up in a cavity of carrier tape.

Based on the above technique, it has been believed that defects caused by the difficulties in picking up and holding a miniature component with a nozzle can be suppressed. Such difficulties include failing to hold the component and holding the component at a tilt.

CITATION LIST

Patent Literature

[PTL 1] Japanese Unexamined Patent Application Publication No. 2006-351911

SUMMARY OF INVENTION

Technical Problem

The defects caused in holding a small component have been decreased with the above technique. However, the defects are still caused with low possibility (approximately 0.01%, for example) in mounting a miniature component onto a substrate. Such defects include cracking or chipping in the miniature electronic component.

As a result of our ardent experiments in order for suppressing the defects, it has been found that in many cases the defects occur: when (i) the diameter of the nozzle which picks up the component and (ii) the length of the component in the longitudinal direction are approximately the same; and when slight displacement is caused in the pickup position as shown in FIG. 8. It has also been ascertained that the defects are caused when the nozzle is over the electrode and other portion of the component, since uneven load is applied to the component when the nozzle picks up or places the component.

Furthermore, it has been found that when image processing is performed to identify the pickup position, the outline of the image indicating the component blurs depending on a magnitude of a reflectance of the electrode provided at both ends of the component, and therefore displacement in the pickup position is caused. The pickup position is the center of the component. Particularly, the carrier tape reflects light depending on the type of the carrier tape, in the same manner as the electrode. This causes a blur and makes it difficult to determine the outline of the image indicating the component. It has also been found that even when displacement is not caused in the identified pickup position of the component, if the size of the electrode provided at both ends of the component is different from each other, the uneven load is applied to the component consequently.

The present invention has been conceived based on the above view, and has an object to provide a component mounting method and a component mounter which can mount even a small component without cracking or chipping the component.

Solution to Problem

In order to achieve the above object, the component mounting method according the present invention is a component mounting method of mounting a component onto a substrate by picking up the component by bringing an end face of a nozzle into contact with a pickup face of the component and placing the picked-up component onto the substrate, the component having an electrode at both ends in a longitudinal direction, the method including: imaging a two-dimensional region including the pickup face of the component to be picked up, the imaging being performed by an imaging unit; identifying, by image processing, a dark color region from image data obtained in the imaging, the dark color region indicating a dark color portion between the electrodes of the component; deriving position data indicating a position of the identified dark color region; and deriving, based on the derived position data, a pickup position indicating a position at which the nozzle picks up the component.

With this, the pickup position can be identified with high accuracy since the image processing can be performed based on a high contrast between the electrodes and the dark color portion. Furthermore, the component can be prevented from being defected due to the uneven load even when a shape of the electrode at the both ends of the fed component are not even, since the nozzle can: hold the component evenly (with even load) with respect to (i) the electrode at the both ends of the component in the longitudinal direction and (ii) the center of the dark color portion between the electrodes by defining the center of the dark color portion as the pickup position; and mount the component onto the substrate.

Furthermore, the component mounting method may further include obtaining a shape and a size of the dark color portion for the component to be picked up, from component information in which (i) a component type indicating a type of a component and (ii) a shape and a size of a dark color portion at a pickup face of the component are associated, and the dark color region may be identified from the image data based on the shape and the size of the obtained dark color portion.

With this, it is possible to accurately identify the dark color region even when a wide variety of components are fed.

Furthermore, the position data may be derived when regions adjacent to both sides of the identified dark color region have brightness greater than or equal to a threshold.

With this, it is possible to accurately identify the dark color region even when, for example, an image indicating the dark color portion and an image indicating the carrier tape are blended because the carrier tape reflects the light in the same manner as the dark color portion of the component.

Furthermore, illuminance may be adjusted by changing gradually from a high level to a low level an illumination intensity of light from an illuminating unit which illuminates the component.

With this, it is possible to accurately identify the dark color region even when the illumination intensity of the illuminating unit is relatively strong. Therefore, the illuminance adjustment is finished in a short time, which contributes to the improvement of the productivity in manufacturing the mounted substrate.

Furthermore, in order to achieve the above object, the component mounter according to the present invention is a component mounter which mounts a component onto a substrate by picking up the component by bringing an end face of a nozzle into contact with a pickup face of the component and placing the picked-up component onto the substrate, the component having an electrode at both ends in a longitudinal direction, the mounter including: an imaging unit configured to image a two-dimensional region including the pickup face of the component to be picked up; an image processing unit configured to identify a dark color region from image data obtained by the imaging unit, the dark color region indicating a dark color portion between the electrodes of the component; and a control unit configured to move, based on the position of the imaging unit and the position of the identified dark color region, the nozzle to a position at which the nozzle picks up the component.

With this, the pickup position can be identified with high accuracy since the image processing can be performed based on a high contrast between the electrodes and the dark color portion. Furthermore, the component can be prevented from being defected due to the uneven load even when a shape of the electrode at the both ends of the fed component are not even, since the nozzle can: hold the component evenly (with even load) by defining the center of the dark color portion as the pickup position; and mount the component onto the substrate.

It is to be noted that implementing the present invention (i) as a program which causes a computer to execute each processing included in the component mounting method and (ii) as a recording medium on which such a program is recorded are also included in working of the present invention. Distributing such a program via a transmission medium such as the Internet or a recording medium such as a DVD is also included in working of the present invention.

Advantageous Effects of Invention

With the present invention, it is possible to mount even a small component by accurately identifying the pickup position and picking up the component without applying the uneven load. As a result, the defects which have been caused in placing the component onto the substrate can be minimized.

DESCRIPTION OF EMBODIMENTS

The following describes an embodiment of the component mounter according to the present invention and an embodiment of the component mounting method implemented with the component mounter.

Figure 1:
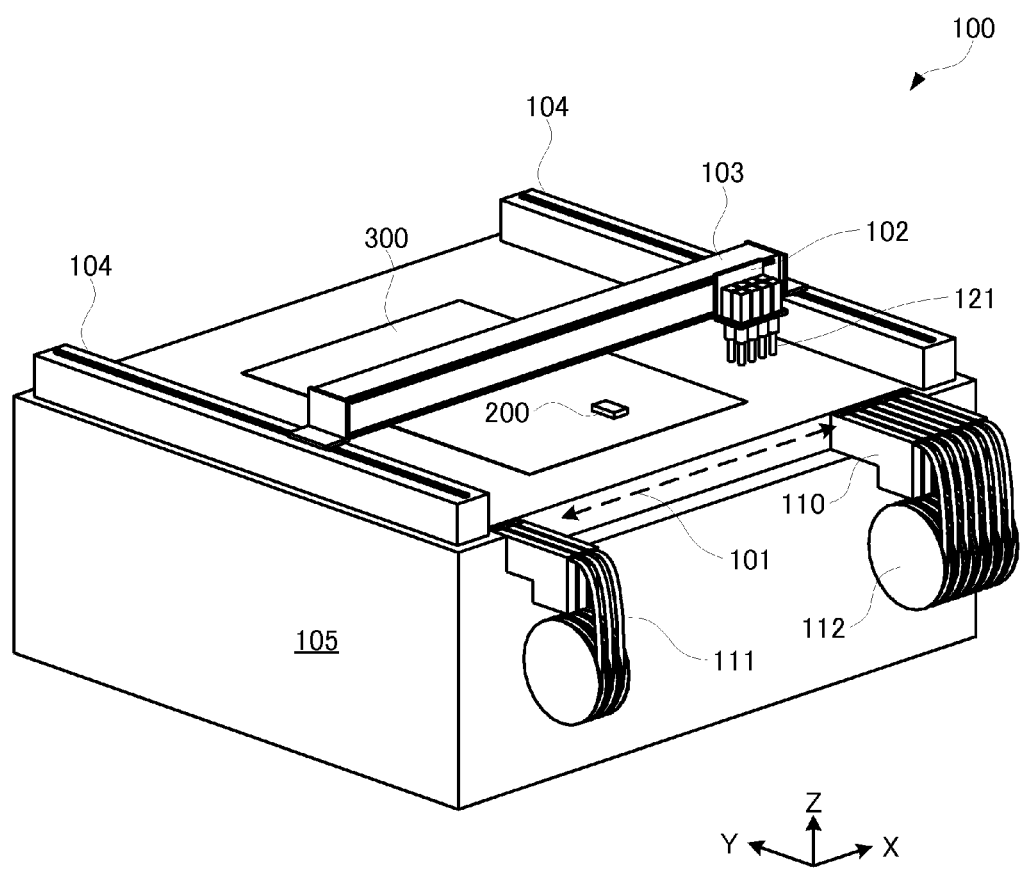
FIG. 1 is a perspective view which shows a component mounter schematically.

FIG. 1 is the perspective view which shows the component mounter schematically.

As shown in FIG. 1, a component mounter 100 is a device which mounts a component 200 onto a substrate 300 by picking up and holding the component 200 fed to the component feeding unit 101 and placing the picked-up component 200 onto the substrate 300, the mounter including: a head 102 which is reciprocatable in an X-axis direction; an X beam 103 which guides the head 102 in the X-axis direction; a Y beam 104 which guides the X beam 103 in an Y-axis direction; and a base 105 which is a basis of the component mounter 100.

A plurality of tape feeders 110 are arranged at the component feeding unit 101. Each of the tape feeders 110 is attached to the component mounter 100 in a detachable manner. The tape feeders 110 are each attached with carrier tape 111 which is fed with rolled around a reel 112.

Figure 2:
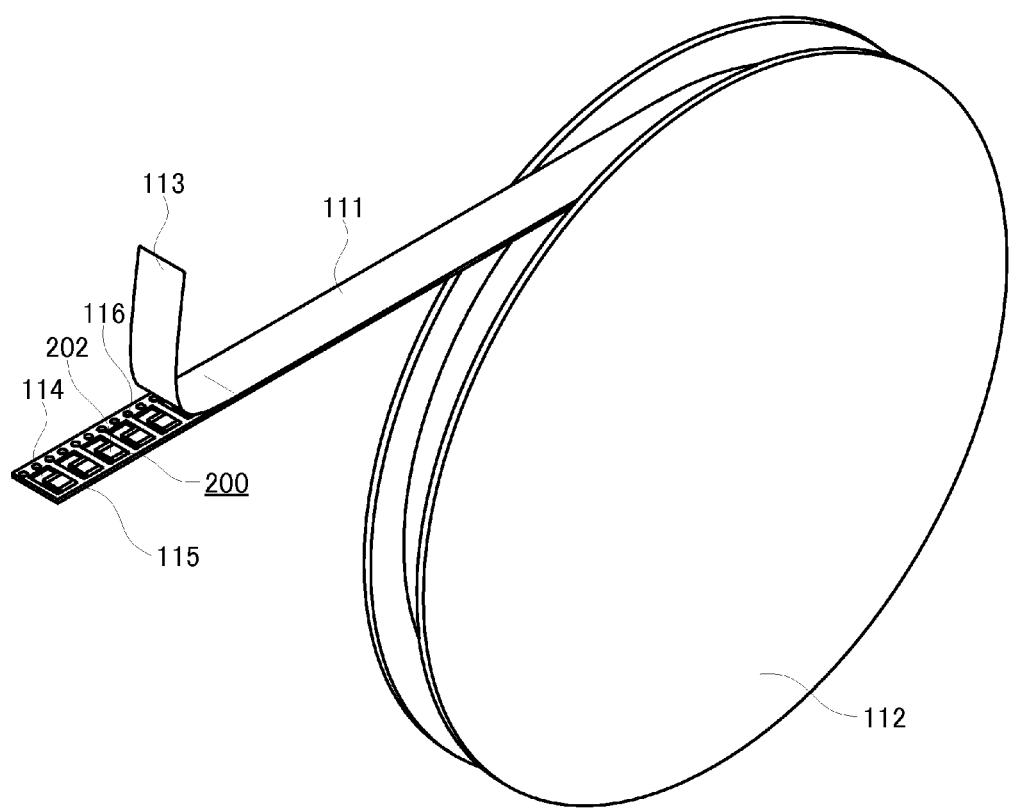
FIG. 2 is a perspective view which shows carrier tape schematically.

FIG. 2 is a perspective view which shows the carrier tape schematically.

The carrier tape 111 is a member in a form of a long belt and is usually fed with rolled around the reel 112. The carrier tape 111 includes: cover tape 113; base tape 115 in which cavities 114 are provided; and through holes 116 which penetrate through the carrier tape 111 in the thickness direction.

The base tape 115 is a member which is a basis of the carrier tape 111, and is thick enough to form the cavities 114 each containing a component 200.

The cavity 114 is space (excavation) provided in the base tape 115 to contain the component 200, and is called a pocket in some cases. The cavities 114 are provided in one line and with evenly spaced, along the longitudinal direction of the carrier tape 111.

The cover tape 113 is a member for holding the components 200 in the cavities 114. The cover tape 113 is peeled off from the base tape 115 by the tape feeder 110, immediately before the component 200 is provided to the component mounter 100.

The through holes 116 are holes which are arranged with evenly spaced along the longitudinal direction of the carrier tape 111. Causing the through holes 116 to mesh with a sprocket or the like makes it possible to forward the carrier tape 111 at an accurate pitch. It is to be noted that, in FIG. 2, the through holes 116 are illustrated only in a tip portion of the base tape 115 and illustration is omitted for other portions. In practice, the through holes 116 are provided allover the longitudinal direction of the carrier tape 111, and also on the cover tape 113.

Figure 3:
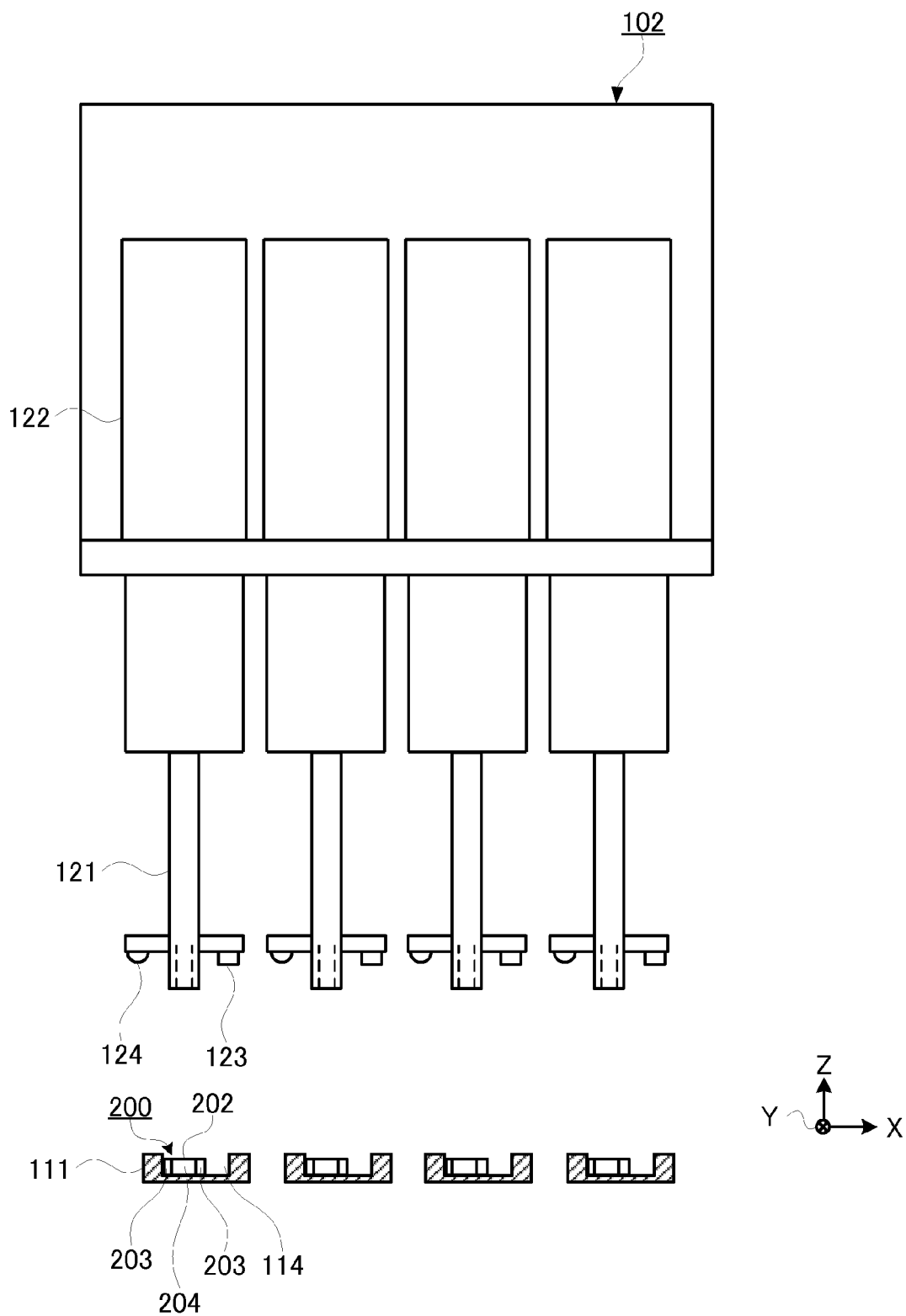
FIG. 3 is a view of a head from the front (Y-axis direction).

FIG. 3 is a view of the head from the front (Y-axis direction).

The head 102 is a device for placing the component 200 onto the substrate by: freely moving in the XY plane; picking up and holding the component 200; and conveying the component 200. The head 102 includes a nozzle 121, a driving unit 122, an imaging unit 123, and an illuminating unit 124 (see FIG. 4).

The nozzle 121 is a member which directly holds the component 200. In the present embodiment, the nozzle 121 is a member formed in a tube and picks up and holds the component 200 by bringing its end face into contact with a pickup face 202 of the component 200 which includes the electrode (203) at the both ends in the longitudinal direction.

The driving unit 122 is a device for reciprocating the nozzle 121 in a Z-axis direction.

The imaging unit 123 is a device which is capable of imaging a two-dimensional region including the pickup face 202 of the component 200 to be picked up. A specific example includes a CCD camera.

The illuminating unit 124 is a device for illuminating light to the pickup face 202 and the peripheral portion. A specific example includes the LED lighting system. It is desirable to adopt the illuminating unit 124 through which light is incident perpendicularly to the pickup face 202 of the component 200 as much as possible. This is desirable because a high contrast can be obtained between a dark color portion 204 and the electrode 203.

The component 200 is an electronic component mounted on a surface of a substrate 300 such as a printed circuit board. An example includes miniature chip components (1005, 0603, and 0402) such as resistors and condensers. The component 200 is in a rectangular parallelepiped shape and includes an electrode 203 at both ends in the longitudinal direction. The portion between the electrodes 203 is the dark color portion 204 which is darker than the electrodes 203.

In the present embodiment, the imaging unit 123 and the illuminating unit 124 are provided for a single nozzle 121. In other words, the head 102 includes the same number of the imaging unit 123 and the illuminating unit 124 as the nozzle 121. It is to be noted that one imaging unit 123 and one illuminating unit 124 may be provided for a plurality of the nozzles 121.

Figure 4:
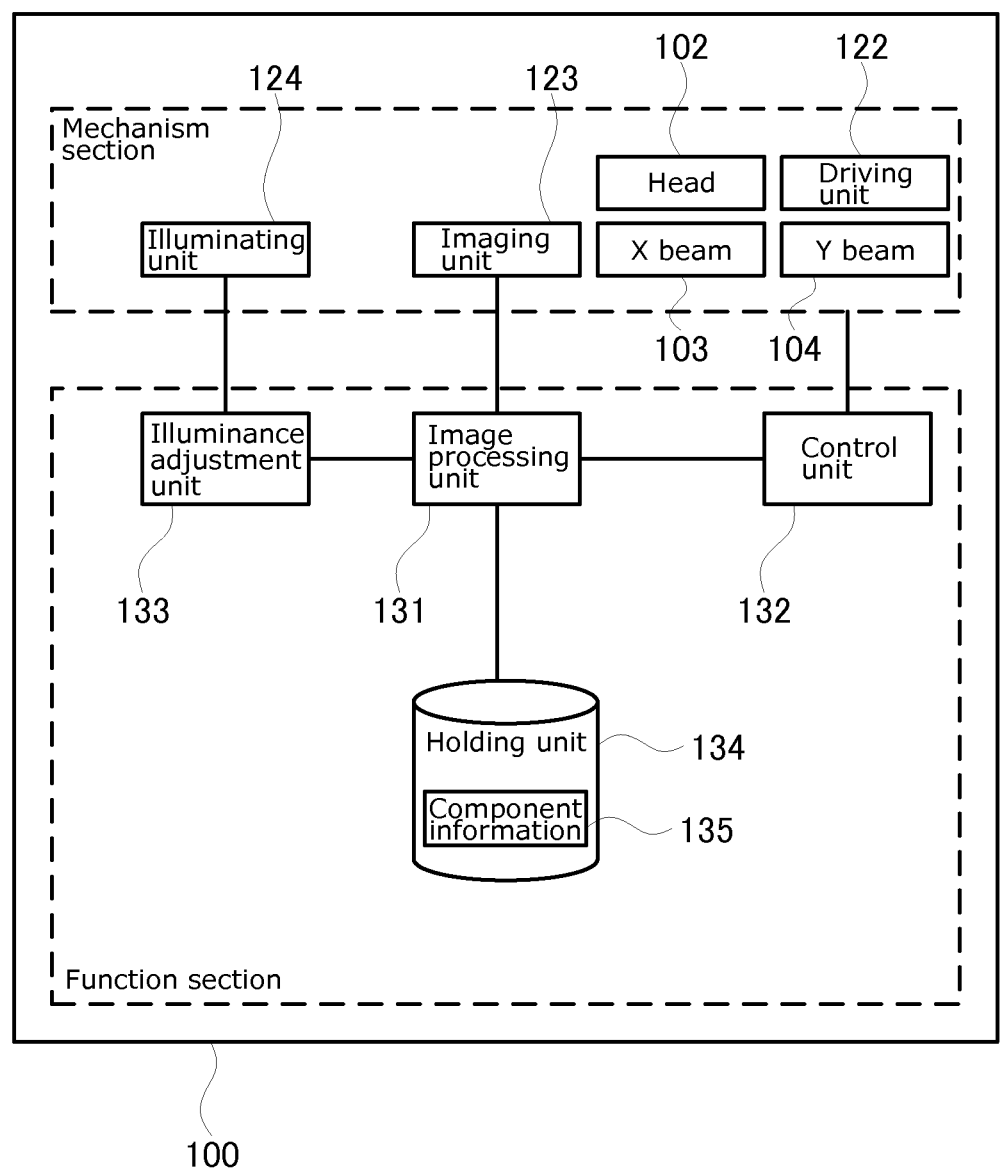
FIG. 4 is a block diagram which shows both of a function section and a mechanism section of the component mounter.

FIG. 4 is a block diagram which shows both of the function section and the mechanism section of the component mounter.

As shown in FIG. 4, the component mounter 100 includes an image processing unit 131, a control unit 132, an illuminance adjustment unit 133, and a holding unit 134, as the function section. In the present embodiment, the image processing unit 131, the control unit 132, and the illuminance adjustment unit 133 are processing units implemented with an arithmetic device (computer) and a program, and the holding unit 134 which holds data or the like is a storage device such as a hard disk. It is to be noted that each of the above devices may exist independently.

The image processing unit 131 is a processing unit configured to identify, by image processing, a dark color region 212 from image data 400 obtained by the imaging unit 123, the dark color region 212 indicating the dark color portion 204 between the electrodes on the both ends of the component 200. Furthermore, the image processing unit 131 (i) obtains from the control unit 132 the position data of the imaging unit 123 obtained when the imaging unit 123 obtained image data 400 through imaging, and (ii) derives the position data of the center of the dark color region 212. It is to be noted that the image processing method can be performed by the conventional processing method and processing logic.

The control unit 132 is a processing unit capable of: controlling the position of each of the elements included in the mechanism section of the component mounter 100, namely the head 102, the X beam 103, the Y beam 104, the driving unit 122, and the like; and recognizing the current position of each of the elements included in the mechanism section. Specifically, the control unit 132 controls a driving source of the component mounter 100, and recognizes the position of each of the elements included in the mechanism section based on the information obtained by the driving source or an encoder. Furthermore, the control unit 132 is capable of moving the head 102 so that the nozzle 121 for the component 200 is at a position in the XY plane at which the nozzle 121 picks up the component 200, based on the information obtained from the image processing unit 131.

The illuminance adjustment unit 133 is a processing unit which changes the intensity of light illuminated by the illuminating unit 124, and determines, based on the image data 400 obtained in each intensity, the intensity of light appropriate for the image processing.

The holding unit 134 is a device in which various information items are stored. An example of the information stored in the holding unit 134 includes: component information 135 in which (i) a component type indicating a type of the component 200 and (ii) a shape and a size of the dark color portion 204 at the pickup face 202 of the component 200 are associated. It is to be noted that the component information 135 may exist as one of component libraries.

Next, the component mounting method implemented with the component mounter 100 is described.

Figure 5:
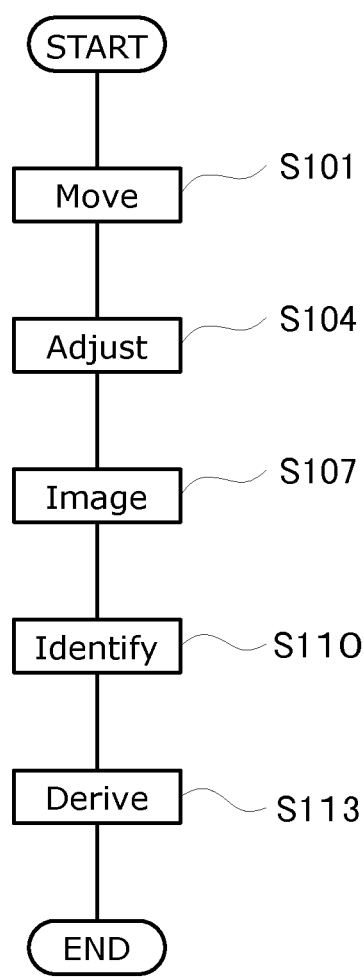
FIG. 5 is a flowchart showing a flow of a mounting method.

FIG. 5 is a flowchart showing a flow of the mounting method.

First, the head 102 is moved above the component feeding unit 101 (S101: Moving) (See FIG. 1).

Here, in the present embodiment, the arrangement pitch of the nozzle 121 in the X-axis direction matches with the arrangement pitch of the component 200 in the X-axis direction of the component feeding unit 101, whereby the plurality of components 200 can be simultaneously picked up by the plurality of nozzles 121.

Next, the illuminance adjustment unit 133 adjusts illuminance by changing gradually from a high level to a low level the illumination intensity of light from the illuminating unit 124 which illuminates the component 200 (S104: Adjusting). Since the dark color region 212 is identified from the image data 400 in the present invention, it is possible to determine the most appropriate illuminating intensity in a short time by adjusting the illuminance from the high level to the low level.

Then, the illuminating unit 124 illuminates the component 200 to be picked up and the peripheral portion at the illuminating intensity adjusted in the adjusting (S104), and the imaging unit 123 images the two-dimensional region including the pickup face 202 of the component 200 (S107: Imaging).

In the present embodiment, the imaging unit 123 is provided for each of the nozzles 121, whereby a plurality of image data items 400 including the plurality of pickup faces 202 of the plurality of components 200 can be simultaneously obtained by the plurality of imaging units 123.

Figure 6:
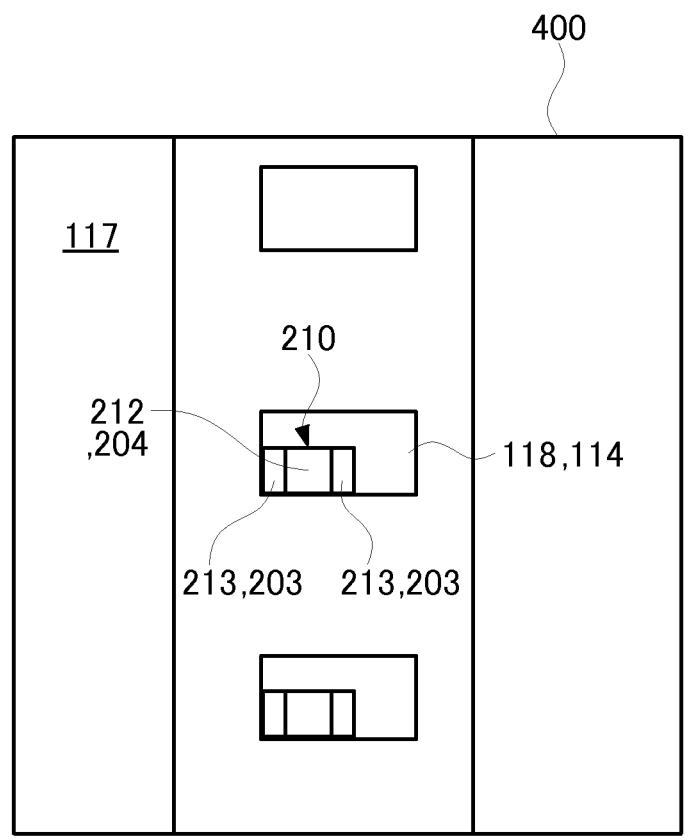
FIG. 6 shows an image data item visually.

FIG. 6 shows an image data item visually.

As shown in FIG. 6, the image data 400 is data obtained by imaging the pickup face 202 and the peripheral portion. In the present embodiment, not only an image of the peripheral portion of the cavity 144, of the carrier tape 111, in which the component 200 to be picked up is contained but also images of the peripheral portions of the cavities 114 which are in front of and behind the cavity in which the component 200 to be picked up is contained. It is to be noted that, in FIG. 6, the carrier tape image 117 is an image indicating the carrier tape 111, and the cavity image 118 is an image indicating the cavity 114. Furthermore, the component image 210 is an image indicating the whole component 200, the dark color region 212 is an image indicating the dark color portion 204, and the light color region 213 is an image indicating the electrode 203. Although the border is clear in FIG. 6 since the image data 400 is illustrated with a diagrammatic drawing, the border is not clear in practical image data 400. Particularly, the border of the light color region 213 is blurred very much since the electrode 203 is likely to reflect diffusely.

Then, the dark color region 212 indicating the dark color portion 204 between the electrodes 203 of the component 200 is identified, by the image processing, from the image data 400 obtained in the imaging S104 (S110: Identifying).

The dark color region 212 can be identified by the conventional image processing method. For example, when the material included in the carrier tape 111 is white paper or white resin which has a higher reflectance than the dark color portion 204 of the component 200, the obtained image data 400 has high brightness in portions other than the dark color region 212. Accordingly, it becomes easier to search and identify the dark color region 212 through the image processing, and the obtaining of the component information 135 becomes unnecessary in some cases.

Meanwhile, when the material included in the carrier tape 111 is antistatic material or the like which has dark color, the obtained image data 400 has a dark region having low brightness other than the dark color region 212. In this case, it is sufficient to obtain the shape of the dark color portion 204 of the component 200 from the component information 135 stored in the holding unit 134, and to identify the dark color region 212 efficiently. For example, if the component information 135 indicates that the shape of the dark color portion 204 in the pickup face 202 of the component 200 to be picked up is square and the length of each side is 0.4 mm, it is sufficient to search and identify the dark color region 212 that matches the square which is 0.4 mm on a side. It is to be noted that the method is also effective in the case where the reflectance of the carrier tape 111 is high.

A further determination may be made on whether or not the portion identified as the dark color region 212 is correct based on the light color region 213. Specifically, it can be determined that the portion is correct when regions adjacent to both sides of the identified dark color region 212 have brightness greater than or equal to a threshold (brightness difference between the dark color region 212 and the light color region 213 is 20, for example).

Then, position data indicating a position of the identified dark color region 212 is derived (S113: Deriving). Specifically, the image processing unit 131: calculates the center (or center of gravity) of the dark color region 212 in the image data 400; and obtains from the control unit 132 the position information of the imaging unit 123 at the time of imaging. Then, based on the two data items, the pickup position indicating the position for the nozzle 121 to pick up the component 200 is derived.

In the present embodiment, the pickup position is derived for each of the four nozzles 121. Here, as a result of deriving the plurality of pickup positions for the plurality of the nozzles 121, a component 200 cannot be picked up simultaneously with other components 200 due to displacement or inclination of the component 200, in some cases. In this case, a condition (position of head 102 when picking up) may be selected with which the most components 200 can be simultaneously picked up from the plurality of pickup positions or with which the number of movements of the head 102 made until picking up all the components 200 is minimized.

Figure 7:
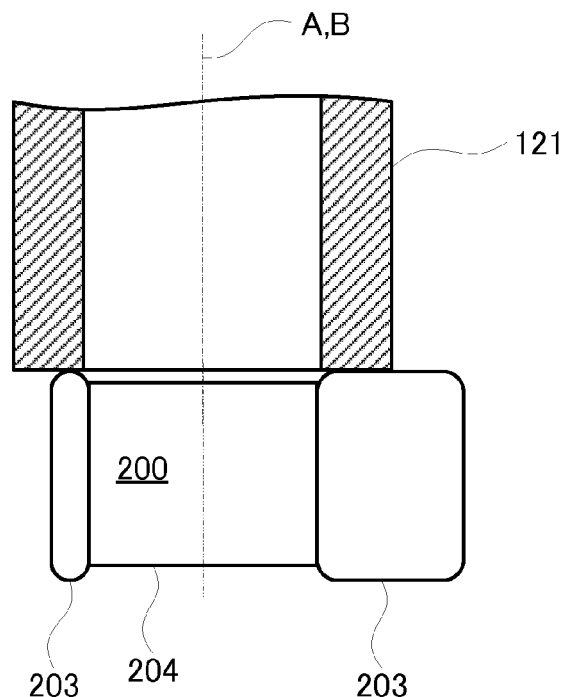
FIG. 7 is a cross section view of part of the component from a side in a state where a pickup position for the nozzle and the center of the dark color portion of the component match.

FIG. 7 is a cross section view of part of the component, from a side, in a state where a pickup position for the nozzle (center position of outer diameter or inner diameter (pickup hole) of the nozzle, for example) and the center of the dark color portion of the component match.

Figure 8:
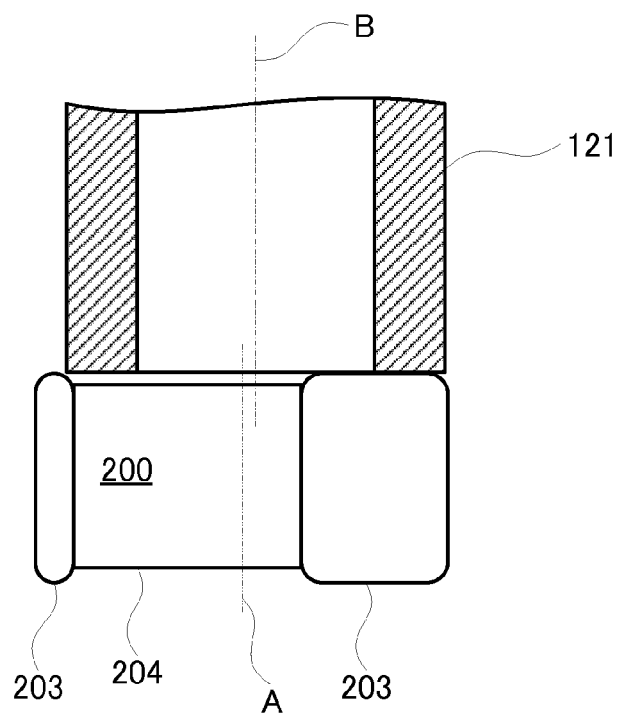
FIG. 8 is a plan view of part of the component from a side in a state where the pickup position for the nozzle and the center of the dark color portion of the component do not match.

FIG. 8 is a plan view of part of the component in a state in which a pickup position of the nozzle and the center of the dark color portion of the component do not match, from a side.

As shown in FIG. 7, when the above component mounting method is adopted with implementing the component mounter 100, the center of the dark color portion 204 of the component 200 in the longitudinal direction (dashed-two dotted line A in FIG. 7) is derived as the pickup position (center position of outside diameter or inside diameter (pickup hole) of the nozzle, for example) (dashed line B in FIG. 7), even when the size of the electrode 203 disposed at the both ends of the component 200 in the longitudinal direction differs significantly. Therefore, the peripheral portion of the center of the length of the component (dashed-two dotted line A in FIG. 8) in the longitudinal direction (outer size) is no longer derived as the pickup position of the nozzle (dashed line B in FIG. 8).

This is because the dark color region 212 can be identified from the image data 400 with high position accuracy, without being much affected by the light color region 213 blurred due to the diffused reflection of the electrode 203.

Accordingly, it is possible to prevent the component 200 from defects, such as fractures or breaks, due to application of uneven load onto the component 200 caused by picking up the component 200 in the state as shown in FIG. 8 and mounting the component 200 onto the substrate 300.

To be more specific, in the case where a component 200 is a miniature component called 1005 and the component 200 is picked up without adopting the present invention, the probability of occurrence of errors caused by the displacement in the pickup positions was 0.02%. However, with adopting the present invention, no error was caused by the displacement in the pickup positions as a result of picking up 10,000 components 200.

It is to be noted that the present invention is not determined by the above embodiment. For example, as another embodiment of the present invention, the constituent elements described in the present description may be optionally combined. Any variations of the present embodiment to be conceived by those skilled in the art without departing from the spirit of the present invention, that is, the meaning of the wording in the claims, are also within the scope of the present invention.

INDUSTRIAL APPLICABILITY

The present invention can be applied in a mounted substrate manufacturing process for manufacturing the mounted substrate by placing an electronic component onto a surface of a printed board or the like.

REFERENCE SIGNS LIST

100 Component mounter
101 Component feeding unit
102 Head
103 X beam
104 Y beam
105 Base
110 Tape feeder
111 Carrier tape
112 Reel
112 Common reel
113 Cover tape
114 Cavity
115 Base tape
116 Through hole
117 Carrier tape image
118 Cavity image
121 Nozzle
122 Driving unit
123 Imaging unit
124 Illuminating unit
131 Image processing unit
132 Control unit
133 Illuminance adjustment unit
134 Holding unit
135 Component information
200 Component
202 Pickup face
203 Electrode
204 Dark color portion
210 Component image
212 Dark color region
213 Light color region
300 Substrate
400 Image data

The invention claimed is:

1. A component mounting method of mounting a component onto a substrate by picking up the component by bringing an end face of a nozzle into contact with a pickup face of the component and placing the picked-up component onto the substrate, the component having an electrode at both ends in a longitudinal direction, the method comprising:
    imaging a two-dimensional region including the pickup face of the component to be picked up, the imaging being performed by an imaging unit;
    identifying, by image processing, a dark color region from image data obtained in the imaging, the dark color region indicating a dark color portion between the electrodes on the both ends of the component;
    deriving position data indicating a position of the identified dark color region; and
    deriving, based on the derived position data, a pickup position indicating a position at which the nozzle picks up the component.

2. The component mounting method according to claim 1, further comprising
    obtaining a shape and a size of the dark color portion for the component to be picked up, from component information in which (i) a component type indicating a type of a component and (ii) a shape and a size of a dark color portion at a pickup face of the component are associated,
    wherein, in the identifying, the dark color region is identified from the image data based on the shape and the size of the obtained dark color portion.

3. The component mounting method according to claim 1, wherein, in the deriving of position data, the position data is derived when regions adjacent to both sides of the identified dark color region have brightness greater than or equal to a threshold.

4. The component mounting method according to claim 1, further comprising
    adjusting illuminance by changing gradually from a high level to a low level an illumination intensity of light from an illuminating unit which illuminates the component.

5. A component mounter which mounts a component onto a substrate by picking up the component by bringing an end face of a nozzle into contact with a pickup face of the component and placing the picked-up component onto the substrate, the component having an electrode at both ends in a longitudinal direction, the mounter comprising:
    an imaging unit configured to image a two-dimensional region including the pickup face of the component to be picked up;
    an image processing unit configured to identify a dark color region from image data obtained by the imaging unit, the dark color region indicating a dark color portion between the electrodes on the both ends of the component; and
    a control unit configured to move, based on the position of the imaging unit and the position of the identified dark color region, the nozzle to a position at which the nozzle picks up the component.

* * * * *